United States Patent
Sakai et al.

(10) Patent No.: US 7,030,000 B2
(45) Date of Patent: Apr. 18, 2006

(54) METHOD FOR FABRICATING A METALLIC OXIDE OF HIGH DIELECTRIC CONSTANT, METALLIC OXIDE OF HIGH DIELECTRIC CONSTANT, GATE INSULATING FILM AND SEMICONDUCTOR ELEMENT

(75) Inventors: Akira Sakai, Nagoya (JP); Yukio Yasuda, Aichi-gun (JP); Shigeaki Zaima, Kasugai (JP); Mitsuo Sakashita, Nagoya (JP); Hiroki Kondo, Nagoya (JP); Shinsuke Sakashita, Nagoya (JP)

(73) Assignee: Nagoya University, Nagoya (JP)

( * ) Notice: Subject to any disclaimer, the term of this patent is extended or adjusted under 35 U.S.C. 154(b) by 0 days.

(21) Appl. No.: 10/807,235

(22) Filed: Mar. 24, 2004

(65) Prior Publication Data

US 2004/0259337 A1   Dec. 23, 2004

(30) Foreign Application Priority Data

Jun. 17, 2003   (JP) ............................. 2003-172182

(51) Int. Cl.
*H01L 21/31*   (2006.01)
*H01L 29/772*   (2006.01)

(52) U.S. Cl. ...................... 438/585; 438/591; 257/410

(58) Field of Classification Search .............. 438/585, 438/591; 257/410
See application file for complete search history.

(56) References Cited

U.S. PATENT DOCUMENTS

| 6,509,283 B1 | 1/2003 | Thomas |
| 2002/0197793 A1 | 12/2002 | Dornfest et al. |
| 2003/0020068 A1 | 1/2003 | Finder |

FOREIGN PATENT DOCUMENTS

| JP | 2002-289843 | 10/2002 |
| JP | 2004-039813 | 2/2004 |

OTHER PUBLICATIONS

T. Kanashima et al., "Preparation by Pulsed Laser Deposition and Characterization of ZrO2, HfO2 and PrOx Thin Films for Hig k Gate Insulator", Jun. 2002, Proceedings of the 13th IEEE International Symposium on Applications of ferroelectrics, pp. 199-202.*

H.J. Osten et al., "Epitaxial Praseodymium Oxide: A New High-k Dielectric", Nov. 2001, Extended Abstracts of International Workshop on Gate Insulators, pp. 100-106.*

H.J. Mussig et al., "Can Praseodymium Oxide be an Alternative High-k Gate Material for Silicon Integrated Circuits?" Oct. 2001, IEEE International Integrated Reliability Workshop Final Report, pp. 1-10.*

(Continued)

*Primary Examiner*—Evan Pert
(74) *Attorney, Agent, or Firm*—Oliff & Berridge, PLC

(57) ABSTRACT

A given metallic oxide film is epitaxially grown on a substrate. Then, the substrate and the metallic oxide film are thermally treated to mix the constituent elements of the substrate with the constituent metallic oxide elements of the metallic oxide film and to form a metallic oxide film of high dielectric constant on the substrate through the mixing of the constituent elements.

20 Claims, 2 Drawing Sheets

OTHER PUBLICATIONS

H.J. Osten et al., "High-k Dielectrics with Ultra-low Leakage Current Based on Prasedymium Oxide", Dec. 2000, International Electron Devices meeting. IEDM Technical Digest, pp. 653-656.*

European Search Report dated Sep. 19, 2005.

Osten, et al., *Epitaxial Praseodymium Oxide: A new high-K dielectric*, pp. 100-106, JWGI (2001).

Liu, et al., *Epitaxial growth of $Pr_2O_3$ on Si(111) and the observation of a hexagonal to cubic phase transition during postgrowth $N_2$ annealing*, 79(5):671-673, Applied Physics Letters (Jul. 30, 2001).

Ferrari, et al., *Chlorine mobility during annealing in $N_2$ in $ZrO_2$ films grown by atomic layer deposition*, 92(12):7675-7677, J. of Applied Physics (Dec. 15, 2002).

Murawala, et al., *Plasma Enhanced Liquid Source-CVD and Rapid Thermal Annealing of Tantalum Penta Oxide Dielectric Material*, Materials, Tsukuba, pp. 527-529 (1992).

Mereu, et al., *Fowler-Nordheim Tunneling Epitaxial Yttrium Oxide Silicon for High-K Gate Applications*, Proceedings of the IEEE International Semiconductor Conference, 2:309-312 (Oct. 8, 2002).

* cited by examiner

METHOD FOR FABRICATING A METALLIC OXIDE OF HIGH DIELECTRIC CONSTANT, METALLIC OXIDE OF HIGH DIELECTRIC CONSTANT, GATE INSULATING FILM AND SEMICONDUCTOR ELEMENT

BACKGROUND OF THE INVENTION

1. Field of Invention

This invention relates to a method for fabricating a metallic oxide of high dielectric constant, a metallic oxide of high dielectric constant, a gate insulating film and a semiconductor element.

2. Description of Related Art

Conventionally, Si oxide film has been employed as a gate insulating film of a semiconductor element such as a Si MOSFET, in view of thermal stability and interfacial characteristic. However, with the development of performance and function of a semiconductor element, thinning the Si oxide film is intended. However, it is considered that the thinning of the Si oxide film is limited. Therefore, attention is paid to an insulating film of high dielectric constant substituted for the Si oxide film as the insulating film of high dielectric constant.

In the use of the insulating film of high dielectric constant as the gate insulating film, various properties are required, such as high dielectric constant, low leak current, low defect density and flat interface between the Si substrate and the insulating film without any interface layer.

A conventionally developed insulating film of high dielectric constant has only a polycrystalline structure, so that the large leak current is flowed through the insulating film because the grain boundaries of the insulating film serve as leak current paths. As a result, the conventional insulating film of high dielectric constant can not be employed as the gate insulating film. Also, in the fabrication of the insulating film of high dielectric constant, an interface layer of low dielectric constant and large surface roughness is formed through the reaction between the insulating film deposited and the Si substrate. Thus, the operating performance of the intended Si MOSFET and the like containing the insulating film of high dielectric constant is deteriorated.

SUMMARY OF THE INVENTION

It is an object of the present invention to provide a new metallic oxide film of high dielectric constant which has a small amount of defects such as crystal grains to inhibit the leak current sufficiently. Thus, it is preferably employed as a gate insulating film or the like of a semiconductor element.

For achieving the above object, this invention relates to a method for fabricating a metallic oxide film of high dielectric constant, comprising the steps of:

epitaxially growing a given metallic oxide film on a substrate, and thermally treating the substrate and the metallic oxide film to mix constituent elements of the substrate with constituent metallic oxide elements of the metallic oxide film and to form the metallic oxide film of high dielectric constant on the substrate.

According to the present invention, the intended metallic oxide film of high dielectric constant can be fabricated through the two fabricating steps of epitaxially growing a metallic oxide film and thermally treating a substrate and the metallic oxide film. In the thermal treatment, the constituent elements of the substrate and the constituent metallic oxide elements of the metallic oxide film are mixed, so that the intended metallic oxide film can be polycrystal or amorphous.

Therefore, the intended metallic oxide film can have sufficient high dielectric constant, and the amount of defect such as crystal grain of the intended metallic oxide film can be reduced sufficiently. As a result, if a Si substrate is employed as the above-mentioned substrate and the insulating film of high dielectric constant is employed as the gate insulating film to fabricate a semiconductor element such as a Si MOSFET, the leak current of the semiconductor element can be reduced sufficiently.

In the present invention, since the above-mentioned epitaxial growth and thermal treatment are performed under equilibrium state, the metallic oxide film of high dielectric constant can be fabricated under stable state in energy. Therefore, if the metallic oxide film is employed as the gate insulating film and the resultant assembly containing the gate insulating film is processed to fabricate a semiconductor element such as a Si MOSFET, the metallic oxide film can not suffer from the thermal treatment and the like in the process. As a result, various properties such as crystal structure of the metallic oxide film can be maintained through the process. Thus, the semiconductor element can be fabricated as designed initially.

Herein, in the metallic oxide film of high dielectric constant of the present invention, the wording "high dielectric constant" is not restricted, but for example, means a relative dielectric constant of 20 or more.

Details, other features and advantages of the present invention will be described below.

BRIEF DESCRIPTION OF THE DRAWINGS

For better understanding of the present invention, reference is made to the attached drawings, wherein.

DETAILED DESCRIPTION OF PREFERRED EMBODIMENTS

This invention will be described in detail hereinafter.

Figure 1:
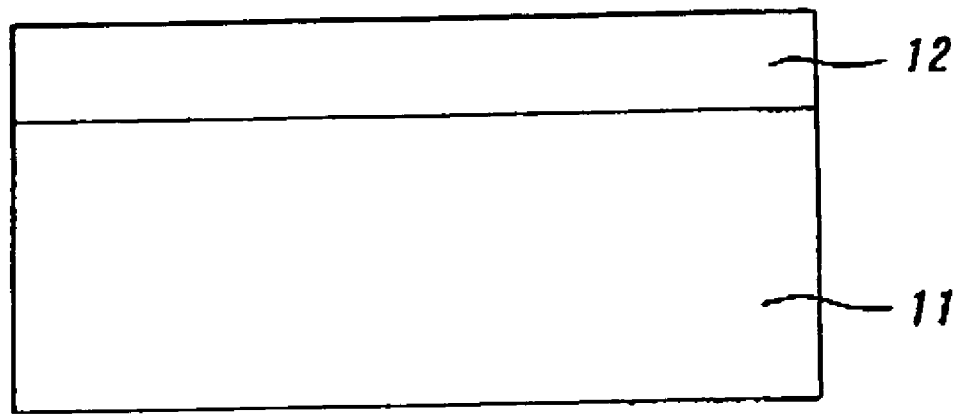
FIG. 1 is an explanatory view of a fabricating method of metallic oxide film with high dielectric constant according to the present invention.
Figure 2:
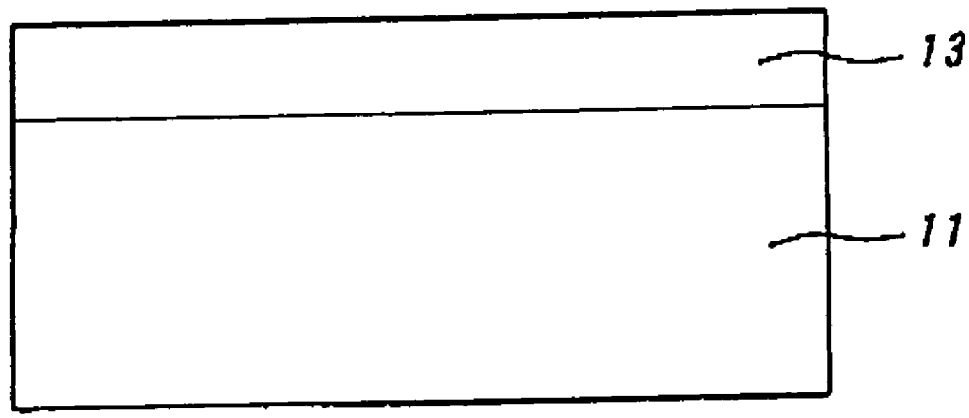
FIG. 2 is another explanatory view of a fabricating method of metallic oxide film with high dielectric constant according to the present invention, and FIG. 3 a high resolution TEM photograph of an amorphous $Pr_2O_3$ film obtained by the fabricating method of the present invention.

FIGS. 1 and 2 are explanatory views of a fabricating method of the metallic oxide film with high dielectric constant according to the present invention. In the present invention, as illustrated in FIG. 1, a metallic oxide film 12 is epitaxially grown on a substrate 11 by means of normal film-forming technique. The metallic oxide film 12 is a raw material for an intended metallic oxide film of high dielectric constant to be formed later, so it contains constituent elements of the intended metallic oxide film. The metallic oxide is preferably made of high dielectric constant material.

In the use of the intended metallic oxide film as a gate insulating film of a MOSFET and the like, the substrate 11 is constructed of a Si-containing substrate. In the use of a Si substrate, some impurities may be contained in the Si substrate, and an additional thermal oxide film is formed on the Si substrate to fabricate a multilayered base substrate.

In the use of the Si-containing substrate as the substrate 11, the metallic oxide film 12 is preferably made of at least one selected from the group consisting of $Pr_2O_3$, $SrTiO_3$, $CeO_2$, $ZrO_2$ and $Y_2O_3$. In this case, the metallic oxide film 12 can be epitaxially grown easily on the Si-containing substrate, and the dielectric constant of the metallic oxide film 12 can be developed. In addition, the constituent metallic oxide elements of the metallic oxide film 12 can be easily mixed with the constituent elements of the substrate, i.e., the Si elements of the Si-containing substrate, so that the intended metallic oxide film of high dielectric constant can be easily fabricated.

Herein, in the epitaxial growth of the metallic oxide film 12 on the substrate 11, if vacuum deposition, sputtering or CVD is employed, the epitaxial growth can be performed by controlling various conditions such as the temperature of the substrate 11. In substitution for the vacuum deposition and the like, liquid epitaxy technique may be employed.

Then, the substrate 11 and the metallic oxide 12 are thermally treated to mix the constituent elements of the substrate 11 with the constituent metallic oxide elements of the metallic oxide film 12 and to form the intended metallic oxide film 13 of high dielectric constant on the substrate 11.

The thermal treatment is required to be performed under the condition of mixing. In particular, the thermal treatment may be preferably performed within a temperature range of 900–1000° C. In this case, the mixing of the constituent elements can be easily performed.

In addition, the thermal treatment may be preferably performed in a non-oxidizing atmosphere. In this case, the formation of an interface layer between the substrate 11 and the metallic oxide film 13 of high dielectric constant can be inhibited, and the surface roughness of the metallic oxide film 13 can be developed. Therefore, various properties such as high dielectric constant of the metallic oxide film 13 can be maintained even though the metallic oxide film 13 is thinned sufficiently, and thus, the metallic oxide film 13 can be employed as a gate insulating film and the like of a semiconductor element such as a MOSFET.

The non-oxidizing atmosphere can be a nitrogen atmosphere, inert gas atmosphere or depressurized atmosphere. In view of simplicity of a thermal treatment apparatus and low cost, the nitrogen atmosphere can be preferably employed.

In the use of the nitrogen atmosphere, the thermal treatment may be performed under atmospheric pressure. In this case, therefore, additional pressurizing operation and depressurizing operation are not required. Thus, the thermal treatment apparatus and the fabricating process can be simplified.

If the thermal treatment is performed under the above-mentioned preferable temperature range, the heating rate is increased as short period of time as possible so as to enhance the mixing of the constituent elements of the substrate 11 and the metallic oxide film 12 and not to inhibit the formation of an intermediate compound. Concretely, the heating rate is preferably set within 50–100° C./sec.

The metallic oxide film 13 of high dielectric constant is amorphous or polycrystal with minute crystal grains through the mixing of the constituent elements of the substrate 11 and the metallic oxide film 12. As a result, the defects such as grain boundaries and the like can be reduced, and thus, leak current due to the defects can be inhibited effectively. Preferably, the metallic oxide film 13 is rendered amorphous.

As mentioned above, the metallic oxide film 13 can be employed as a gate insulating film of a semiconductor element such as a MOSFET, and the multilayered structure constructed of the metallic oxide film 13 and the substrate 11 can be employed as a gate insulating film structure if the substrate 11 is made of the Si-containing substrate.

In this embodiment, as illustrated in FIGS. 1 and 2, since the mixing of the constituent elements is performed throughout the thickness of the metallic oxide film 12, the metallic oxide film 12 is diminished and converted into the metallic oxide film 13 of high dielectric constant. If the mixing of the constituent elements is stopped on the way of the thickness of the metallic oxide film 12, the metallic oxide film 12 remains partially on the metallic oxide film 13 of high dielectric constant. In the latter case, therefore, the remaining metallic oxide film 12 is removed by means of etching after the formation of the metallic oxide film 13.

EXAMPLE

A Si substrate was prepared, and a $Pr_2O_3$ film was epitaxially grown in a thickness of 8 nm on the Si substrate by means of electron beam deposition. In the epitaxial growth, the Si substrate was heated at 500° C. Then, the Si substrate and the $Pr_2O_3$ film were thermally treated at 1000° C. for 30 seconds under nitrogen atmosphere and atmospheric pressure to mix the Si elements of the Si substrate into the $Pr_2O_3$ film. Herein, the Si substrate and the $Pr_2O_3$ film were heated at 1000° C. for 15 seconds.

Figure 3:
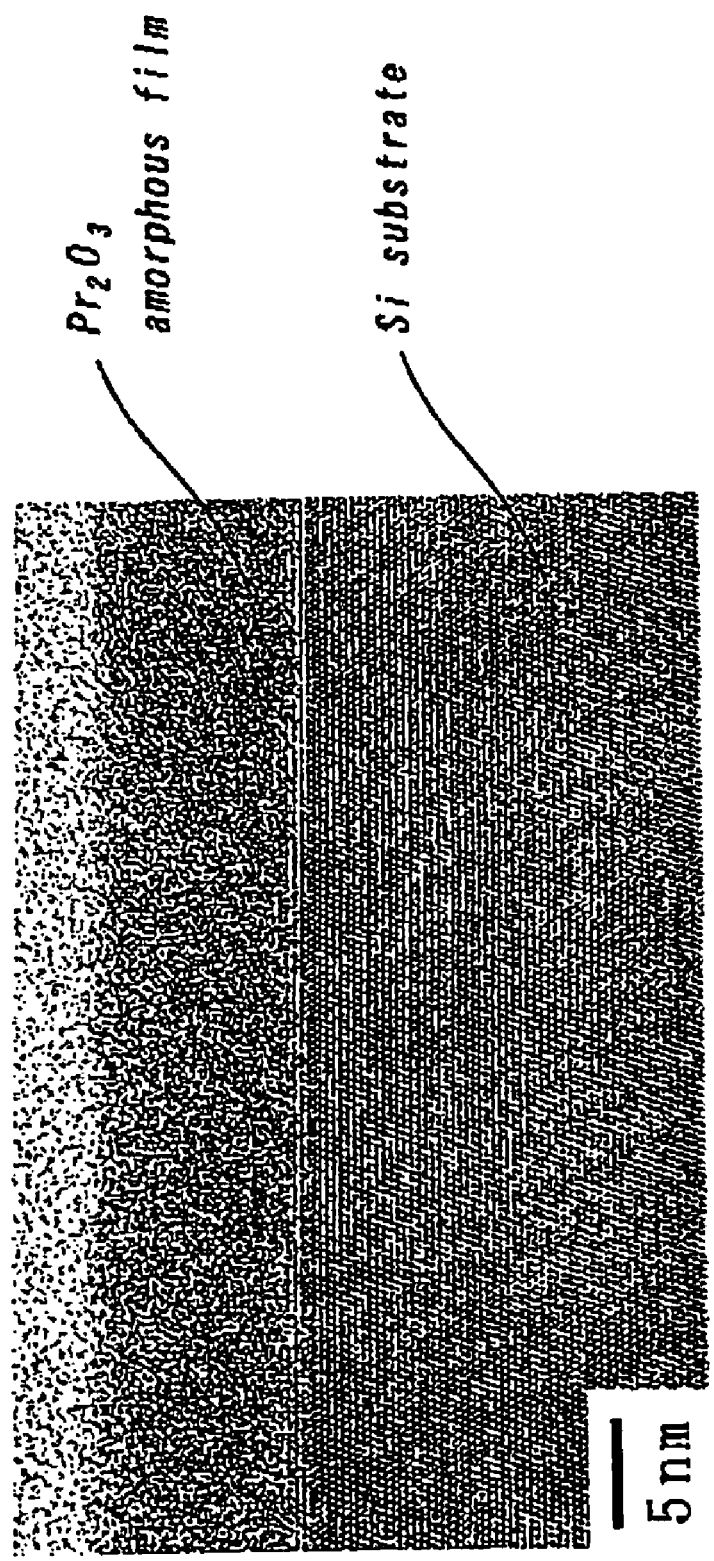

FIG. 3 is a high resolution TEM photograph relating to the cross section of the multilayered structure constructed of the Si substrate and the $Pr_2O_3$ film after the thermal treatment. As is apparent from FIG. 3, it was turned out that the $Pr_2O_3$ film was amorphous through the mixing of the constituent elements. It is also turned out that no interface layer is formed between the Si substrate and the amorphous $Pr_2O_3$ film. The specific conductive capacity of the $Pr_2O_3$ film was 20.

Then, a Pt electrode was formed on the amorphous $Pr_2O_3$ film to measure the leak current density. At the measurement, it was turned out that the leak current density was $3.6 \times 10^{-9} A/cm^2$. Therefore, the amorphous $Pr_2O_3$ film can be preferably employed as a gate insulating film of a MOSFET and the like.

Although the present invention was described in detail with reference to the above examples, this invention is not limited to the above disclosure and every kind of variation and modification may be made without departing from the scope of the present invention.

As mentioned above, according to the present invention a new metallic oxide film of high dielectric constant can be provided which has small amount of defects such as crystal grains to inhibit the leak current sufficiently and thus, preferably is employed as a gate insulating film or the like of a semiconductor element.

What is claimed is:

1. A method for fabricating a metallic oxide film of high dielectric constant, comprising the steps of:
   epitaxially growing a given metallic oxide film on a substrate, and
   thermally treating said substrate and said metallic oxide film within a temperature range of from 900° C. to 1000° C. to mix constituent elements of said substrate with constituent metallic oxide elements of said metallic oxide film throughout said metallic oxide film to form said metallic oxide film of high dielectric constant on said substrate.

2. The fabricating method as defined in claim 1, wherein said substrate includes Si.

3. The fabricating method as defined in claim 1, wherein said metallic oxide film is made of at least one selected from the group consisting of $Pr_2O_3$, $SrTiO_3$, $CeO_2$, $ZrO_2$ and $Y_2O_3$.

4. The fabricating method as defined in claim 1, wherein said thermal treatment is performed within a temperature range of 900–1100° C.

5. The fabricating method as defined in claim 1, wherein said thermal treatment is performed under non-oxidizing atmosphere.

6. The fabricating method as defined in claim 5, wherein said non-oxidizing atmosphere is nitrogen atmosphere.

7. The fabricating method as defined in claim 1, wherein said thermal treatment is performed under atmospheric pressure.

8. The fabricating method as defined in claim 4, wherein in said thermal treatment, heating rate up to said temperature range is set to 50–100° C./sec.

9. The fabricating method as defined in claim 1, wherein said metallic oxide film of high dielectric constant is amorphous.

10. The fabricating method as defined in claim 1, wherein relative dielectric constant of said metallic oxide film of high dielectric constant is 20 or more.

11. The fabricating method as defined in claim 1, wherein no interface layer is formed between said substrate and said metallic oxide film of high dielectric constant.

12. A metallic oxide film of high dielectric constant made by a fabricating method as defined in claim 1.

13. The metallic oxide film as defined in claim 12, which is formed on a given substrate not via an interface layer.

14. The metallic oxide film as defined in claim 13, which is formed in amorphous.

15. The metallic oxide film as defined in claim 13, wherein said substrate includes Si.

16. The metallic oxide film as defined in claim 15, which includes at least one selected from the group consisting of $Pr_2O_3$, $SrTiO_3$, $CeO_2$, $ZrO_2$ and $Y_2O_3$.

17. The metallic oxide film as defined in claim 12, which has relative dielectric constant of 20 or more.

18. A gate insulating film made of a metallic oxide film of high dielectric constant as defined in claim 12.

19. A semiconductor element including a gate insulating film as defined in claim 18.

20. A metallic oxide film of high dielectric constant comprising constituent elements mixed with constituent elements of a substrate and constituent elements of a given metallic oxide film which is epitaxially grown on said substrate, wherein said metallic oxide film is minutely polycrystal or amorphous.

* * * * *